US012581736B2

(12) United States Patent
Sugiyama et al.

(10) Patent No.: US 12,581,736 B2
(45) Date of Patent: Mar. 17, 2026

(54) TFT SUBSTRATE AND TFT SUBSTRATE MANUFACTURING METHOD

(71) Applicant: Magnolia White Corporation, Tokyo (JP)

(72) Inventors: Hiroki Sugiyama, Tokyo (JP); Hiroshi Inamura, Tokyo (JP); Kaoru Taketa, Tokyo (JP); Yoshihide Ohue, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 337 days.

(21) Appl. No.: 18/073,046

(22) Filed: Dec. 1, 2022

(65) Prior Publication Data

US 2023/0187456 A1 Jun. 15, 2023

(30) Foreign Application Priority Data

Dec. 9, 2021 (JP) ................................. 2021-200411

(51) Int. Cl.
*G02F 1/1368* (2006.01)
*G02F 1/1362* (2006.01)
(Continued)

(52) U.S. Cl.
CPC ....... *H10D 86/60* (2025.01); *G02F 1/136227* (2013.01); *G02F 1/136286* (2013.01);
(Continued)

(58) Field of Classification Search
CPC .. H10D 86/60; H10D 30/6755; H10D 86/021; H10D 86/423; H10D 86/441;
(Continued)

(56) References Cited

U.S. PATENT DOCUMENTS 5,995,178 A * 11/1999 Fujikawa .............. G02F 1/1362
349/55
6,633,359 B1 * 10/2003 Zhang ............... G02F 1/136286
349/39
(Continued)

FOREIGN PATENT DOCUMENTS

JP 2001-051303 A 2/2001
JP 2007-011261 A 1/2007
(Continued)

OTHER PUBLICATIONS

Office Action issued in related Japanese Patent Application No. 2021-200411 issued on Sep. 9, 2025 and English translation of same. 8 pages.

*Primary Examiner* — Charles S Chang
(74) *Attorney, Agent, or Firm* — K&L Gates LLP

(57) ABSTRACT

A TFT substrate includes a substrate, a plurality of transistors provided on the substrate and each including an oxide semiconductor layer, a plurality of scanning lines electrically coupled to gates of the transistors and extending in a first direction, a plurality of signal lines electrically coupled to the oxide semiconductor layers of the transistors and extending in a second direction intersecting the first direction, an insulating film covering the signal lines and the oxide semiconductor layers, and a coupling wire provided on the insulating film. At least one of the signal lines is separated in the second direction by a slit, and the coupling wire electrically couples one signal line and another signal line adjacent to each other in the second direction across the slit.

4 Claims, 18 Drawing Sheets

(51) Int. Cl.

| | |
|---|---|
| *H10D 30/67* | (2025.01) |
| *H10D 86/01* | (2025.01) |
| *H10D 86/40* | (2025.01) |
| *H10D 86/60* | (2025.01) |
| *G06V 40/13* | (2022.01) |

(52) U.S. Cl.
CPC ....... *G02F 1/1368* (2013.01); *H10D 30/6755* (2025.01); *H10D 86/021* (2025.01); *H10D 86/423* (2025.01); *H10D 86/441* (2025.01); *G06V 40/1318* (2022.01)

(58) Field of Classification Search
CPC ......... G02F 1/136227; G02F 1/136286; G02F 1/1368; G06V 40/1318
USPC ....................................................... 349/54–55
See application file for complete search history.

(56) References Cited

U.S. PATENT DOCUMENTS

| | | | |
|---|---|---|---|
| 2007/0002195 | A1 | 1/2007 | Cho |
| 2007/0298554 | A1 | 12/2007 | Long et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0239335 | A1 | 9/2009 | Akimoto et al. |
| 2009/0305461 | A1 | 12/2009 | Akimoto et al. |
| 2010/0025675 | A1 | 2/2010 | Yamazaki et al. |
| 2010/0136743 | A1 | 6/2010 | Akimoto et al. |
| 2011/0104851 | A1 | 5/2011 | Akimoto et al. |
| 2011/0109532 | A1* | 5/2011 | Choi .................. H10D 30/6741<br>438/34 |
| 2011/0117697 | A1 | 5/2011 | Akimoto et al. |
| 2011/0121290 | A1 | 5/2011 | Akimoto et al. |
| 2011/0163311 | A1 | 7/2011 | Akimoto et al. |
| 2012/0280257 | A1* | 11/2012 | Zhou ..................... H10D 86/60<br>438/34 |
| 2015/0340513 | A1 | 11/2015 | Akimoto et al. |
| 2019/0051759 | A1 | 2/2019 | Akimoto et al. |
| 2019/0326444 | A1 | 10/2019 | Akimoto et al. |
| 2022/0069137 | A1 | 3/2022 | Akimoto et al. |

FOREIGN PATENT DOCUMENTS

| | | | |
|---|---|---|---|
| JP | 2007-096055 | A | 4/2007 |
| JP | 2007-123861 | A | 5/2007 |
| JP | 2008-003610 | A | 1/2008 |
| JP | 2010-056546 | A | 3/2010 |

* cited by examiner

TFT SUBSTRATE AND TFT SUBSTRATE MANUFACTURING METHOD

CROSS-REFERENCE TO RELATED APPLICATION

This application claims the benefit of priority from Japanese Patent Application No. 2021-200411 filed on Dec. 9, 2021, the entire contents of which are incorporated herein by reference.

BACKGROUND

1. Technical Field

The present disclosure relates to a thin film transistor (TFT) substrate and a TFT substrate manufacturing method.

2. Description of the Related Art

A TFT substrate on which a plurality of thin film transistors (TFTs) are disposed is used in a display device, a detection device, and the like. For example, an oxide semiconductor has been known as a semiconductor material used for a thin film transistor (refer to Japanese Patent Application Laid-open Publication No. 2007-123861 and Japanese Patent Application Laid-open Publication No. 2007-96055).

With respect to a TFT substrate including a thin film transistor using an oxide semiconductor, a reduction in characteristic variance of the thin film transistor has been sought for.

SUMMARY

A TFT substrate according to an embodiment of the present disclosure includes a substrate, a plurality of transistors provided on the substrate and each including an oxide semiconductor layer, a plurality of scanning lines electrically coupled to gates of the transistors and extending in a first direction, a plurality of signal lines electrically coupled to the oxide semiconductor layers of the transistors and extending in a second direction intersecting the first direction, an insulating film covering the signal lines and the oxide semiconductor layers, and a coupling wire provided on the insulating film. At least one of the signal lines is separated in the second direction by a slit, and the coupling wire electrically couples one signal line and another signal line adjacent to each other in the second direction across the slit.

A TFT substrate manufacturing method includes sequentially stacking a plurality of scanning lines, an oxide semiconductor layer, and a plurality of signal lines on a substrate and forming a slit at at least one of the signal lines to separate the signal line in a direction in which the signal lines extend, forming an insulating film covering the oxide semiconductor layer and the signal lines and forming a contact hole in a region of the insulating film, the region overlapping each of the one signal line and the other signal line adjacent to each other across the slit, and forming a coupling wire on the insulating film and electrically coupling the one signal line and the other signal line through the contact hole.

DETAILED DESCRIPTION

Modes (embodiments) of the present disclosure will be described below in detail with reference to the accompanying drawings. Contents described in the embodiments below do not limit the present disclosure. Components described below include those that could be easily thought of by the skilled person in the art and those identical in effect. The components described below may be combined as appropriate. What is disclosed herein is merely exemplary, and any modification that could be easily thought of by the skilled person in the art as appropriate without departing from the gist of the present disclosure is contained in the scope of the present disclosure. For clearer description, the drawings are schematically illustrated for the width, thickness, shape, and the like of each component as compared to an actual aspect in some cases, but the drawings are merely exemplary and do not limit interpretation of the present disclosure. In the present disclosure and drawings, any element same as that already described with reference to an already described drawing is denoted by the same reference sign, and detailed description thereof is omitted as appropriate in some cases.

In the present specification and claims, an expression with "on" in description of an aspect in which one structural body is disposed on another structural body includes both a case in which the one structural body is directly disposed on the other structural body in contact and a case in which the one structural body is disposed above the other structural body with still another structural body interposed therebetween, unless otherwise stated in particular.

First Embodiment

Figure 1:
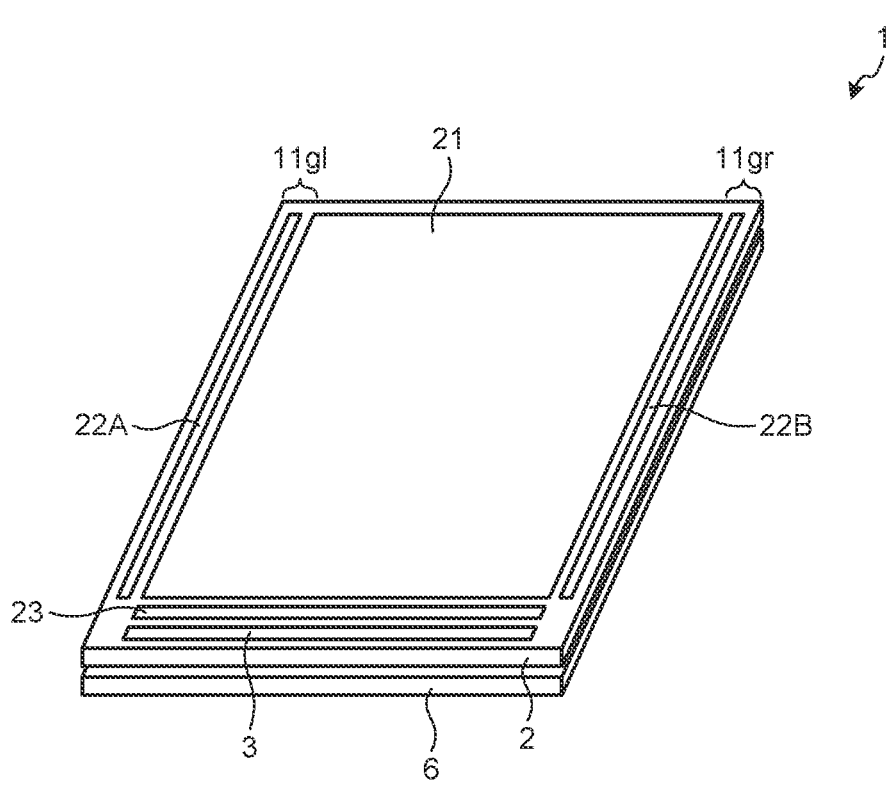
FIG. 1 is an explanatory diagram illustrating an exemplary display device including a TFT substrate according to a first embodiment.

FIG. 1 is an explanatory diagram illustrating an exemplary display device including a TFT substrate according to a first embodiment. As illustrated in FIG. 1, this display device 1 includes a display unit 2 and a backlight 6. The display device 1 may be a transmissive or transflective display device or may be a reflective display device including no backlight 6.

In a plan view, the display unit 2 has a display region 21 in which an image is displayed, and peripheral regions 11gl and 11gr outside the display region 21, each peripheral region being a non-display region in which no image can be displayed.

The backlight 6 is provided below the display unit 2 (on a surface opposite a surface on which an image is displayed). The backlight 6 may be, for example, what is called a side-light backlight including a light guiding plate provided at a position corresponding to the display region 21, and a plurality of light sources arranged at one end or both ends of the light guiding plate. Each light source is, for example, a light emitting diode (LED) configured to emit light in a predetermined color. The backlight 6 may be what is called a directly-under backlight including a light source (for example, LED) provided directly under the display region 21. In description of the display device 1 of the present embodiment, a light source is the backlight 6 disposed under the display unit 2 but may be a front light disposed above the display unit 2.

Figure 2:
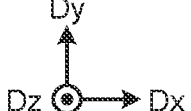
FIG. 2 is a block diagram illustrating an exemplary system of the display device.

FIG. 2 is a block diagram illustrating an exemplary system of the display device. As illustrated in FIG. 2, the display region 21 has a matrix structure (row-column configuration) in which pixels SPX each including a liquid crystal layer are disposed in m rows and n columns as units each being one pixel on display. In the present embodiment, a row means a pixel row including n pixels SPX arrayed in one direction. A column means a pixel column including m pixels SPX arrayed in a direction orthogonal to the direction in which the rows are arrayed. The values m and n are determined in accordance with a display resolution in a vertical direction and a display resolution in a horizontal direction.

An external signal to a driver IC 3 illustrated in FIG. 2 or drive electric power that drives the driver IC 3 is transmitted from a non-illustrated flexible printed circuit (FPC). A first vertical driver 22A and a second vertical driver 22B (vertical drive circuit) sandwich the display region 21.

The driver IC 3 has functions of an interface (I/F) and a timing generator. The driver IC 3 generates common potential (counter electrode potential) Vcom that is common to the pixels and provided to a pixel electrode 72 for each pixel SPX, and provides the common potential Vcom to the display region 21. The driver IC 3 may be integrated with a horizontal driver 23 to constitute an integrated circuit.

In the display region 21, a scanning line 24 is wired for each row in the array of m rows and n columns of the pixels SPX, and a signal line 25 is wired for each column in the array. The first vertical driver 22A and the second vertical driver 22B sequentially output a gate drive signal to a plurality of scanning lines 24 and select each row of pixels SPX. The horizontal driver 23 writes display data to the pixels SPX in the selected row through the signal lines 25.

Figure 3:
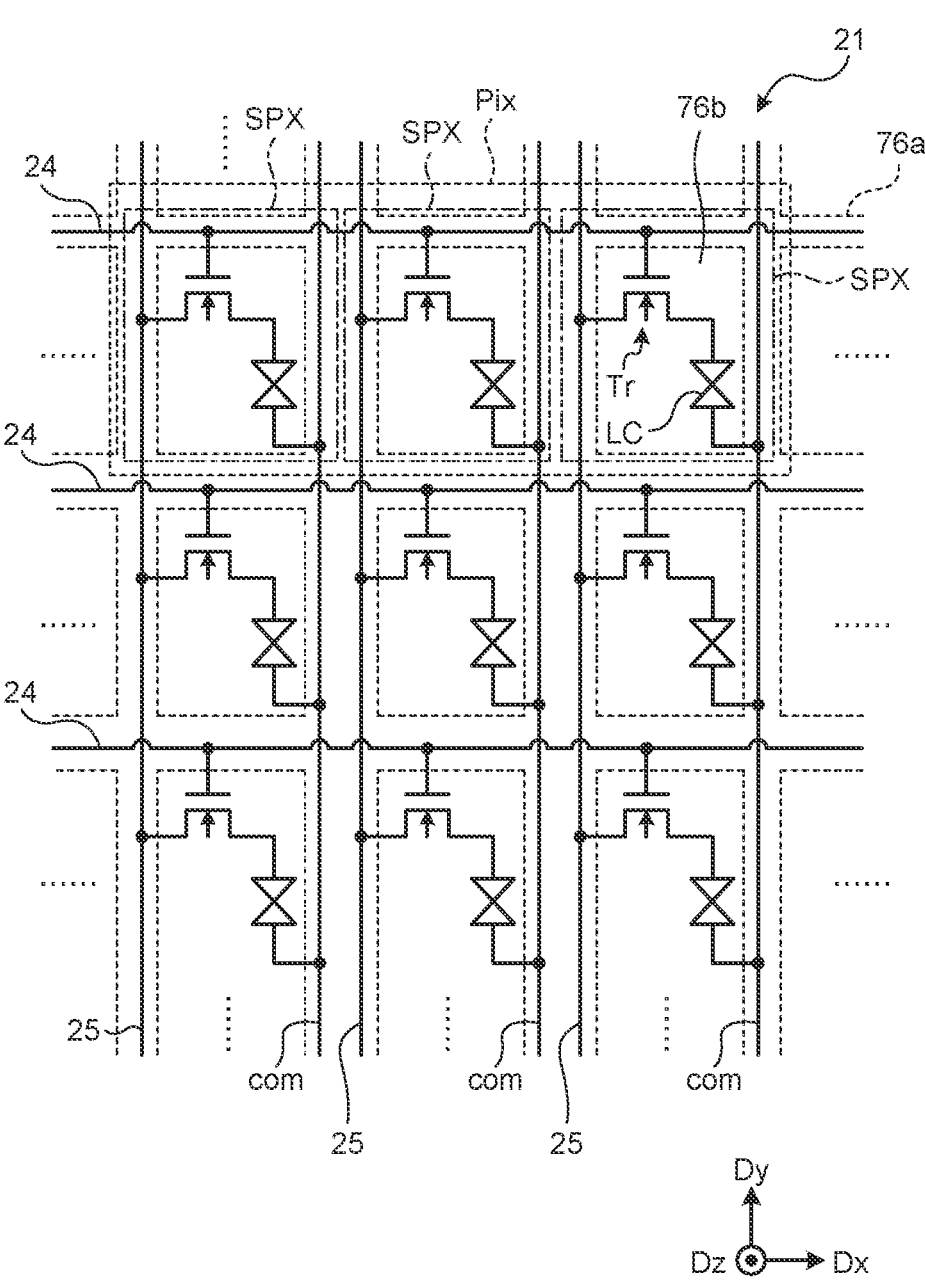
FIG. 3 is a circuit diagram illustrating an exemplary configuration of pixels of the display device.

FIG. 3 is a circuit diagram illustrating an exemplary configuration of pixels of the display device. Wires such as the signal lines 25 through which a pixel signal as display data is supplied to transistors (thin film transistors (TFTs)) Tr of the pixels SPX illustrated in FIG. 3, and the scanning lines 24 that drive the transistors Tr are formed in the display region 21. Each pixel SPX includes the transistor Tr and a liquid crystal capacitor LC. In this example, the transistor Tr is configured as an n-channel metal-oxide-semiconductor (MOS) TFT. One of the source and drain electrodes of the transistor Tr is coupled to the corresponding signal line 25, the gate thereof is coupled to the corresponding scanning line 24, and the other of the source and drain electrodes is coupled to one end of the liquid crystal capacitor LC. The one end of the liquid crystal capacitor LC is coupled to the transistor Tr, and the other end thereof is coupled to the common potential Vcom of a common electrode com.

The common potential Vcom of the common electrode com is coupled to a non-illustrated drive electrode driver and supplied with voltage from the drive electrode driver. Each pixel SPX is mutually coupled, through the common potential Vcom of the common electrode com, to any other pixel SPX belonging to the same column in the display region 21.

Figure 4:
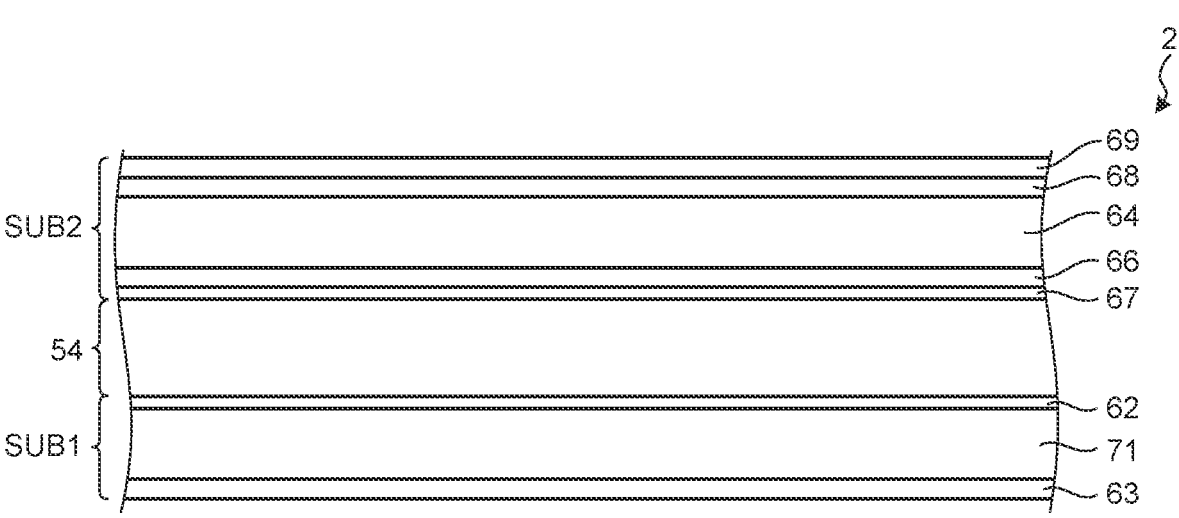
FIG. 4 is a sectional view illustrating an exemplary display unit.

The scanning lines 24 and the signal lines 25 are disposed in regions overlapping a black matrix 76a, which is in the same layer as a color filter 66 (refer to FIG. 4). Opening parts 76b are regions in which no black matrix 76a is disposed.

For example, color regions colored in three colors of red (R), green (G), and blue (B) are periodically arrayed in the color filter 66 (refer to FIG. 4). The red (R), green (G), and blue (B) color regions of the color filter 66 are arrayed at positions corresponding to the opening parts 76b illustrated in FIG. 3. A pixel Pix includes three pixels SPX, and a set of the color regions in the three colors of R, G, and B are associated with the respective pixels SPX. Accordingly, the pixel Pix is constituted by a set of the pixels SPX corresponding to the color regions in the three colors. Thus, each pixel SPX is also referred to as a sub pixel. The color filter 66 may include color regions in four or more colors. In this case, the pixel Pix may include four or more pixels SPX.

FIG. 4 is a sectional view illustrating an exemplary display unit. As illustrated in FIG. 4, the display unit 2 includes a TFT substrate SUB1, a counter substrate SUB2 oppositely disposed in a direction perpendicular to a surface of the TFT substrate SUB1, and a liquid crystal layer 54 inserted between the TFT substrate SUB1 and the counter substrate SUB2. The backlight 6 is disposed on a surface of the TFT substrate SUB1 on a side opposite the liquid crystal layer 54. In the present specification, the direction from the TFT substrate SUB1 toward the counter substrate SUB2 is defined as upward or an upper side.

A large number of liquid crystals are dispersed in the liquid crystal layer 54. The liquid crystals of the liquid crystal layer 54 modulate passing light in accordance with the state of electric field and are driven in a horizontal electric field mode such as fringe field switching (FFS) or in-plane switching (IPS).

The TFT substrate SUB1 includes a substrate 71 that is a translucent substrate such as glass, a first alignment film 62 stacked on the liquid crystal layer 54 side of the substrate 71, and a first polarization plate 63 stacked on the substrate 71 on a side opposite the liquid crystal layer 54. The first alignment film 62 aligns the orientations of liquid crystal molecules in the liquid crystal layer 54 in a predetermined direction, and directly contacts the liquid crystal layer 54.

The first alignment film 62 is made of a polymer material such as polyimide and formed by, for example, providing rubbing processing on applied polyimide or the like. The first polarization plate 63 has a function to convert incident light from the backlight 6 side into linearly polarized light.

The counter substrate SUB2 includes a substrate 64 that is a translucent insulating substrate such as glass, the color filter 66 formed on the liquid crystal layer 54 side of the substrate 64, a second alignment film 67 formed on the liquid crystal layer 54 side of the color filter 66, a phase difference plate 68 formed on the substrate 64 on a side opposite the liquid crystal layer 54 side, and a second polarization plate 69 formed on the phase difference plate 68 on a side opposite the substrate 64 side.

The display device 1 may be provided, as necessary, with a cover member formed of a glass substrate or a resin substrate, or a detection device such as a touch panel.

Figure 5:
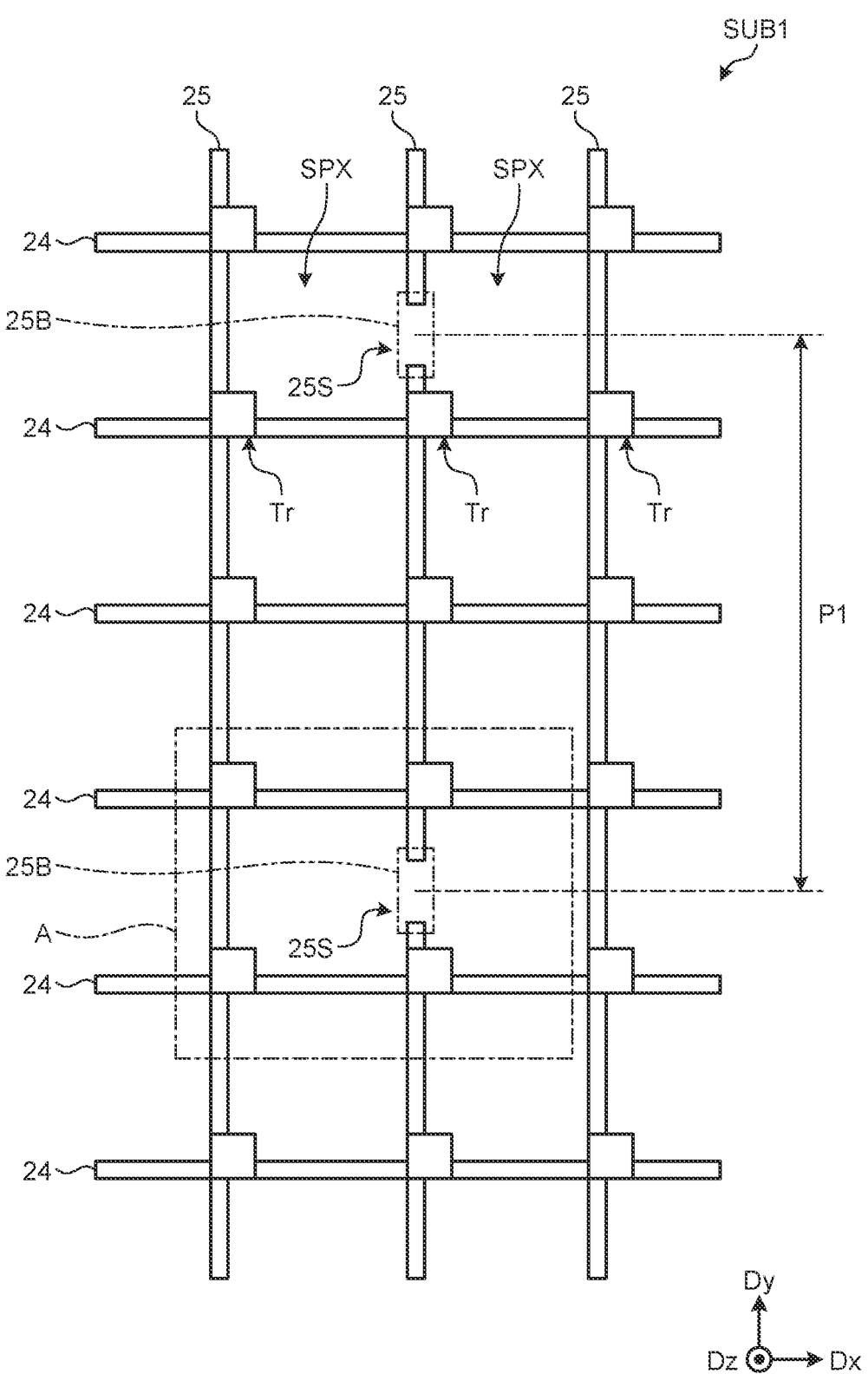
FIG. 5 is a plan view schematically illustrating the relation among transistors, scanning lines, and signal lines in the TFT substrate according to the first embodiment.

The following describes a detailed configuration of the TFT substrate SUB1. FIG. 5 is a plan view schematically illustrating the relation among transistors, scanning lines, and signal lines in the TFT substrate according to the first embodiment. As illustrated in FIG. 5, the scanning lines 24 each extend in a first direction Dx and are arrayed alongside one another in a second direction Dy intersecting the first direction Dx. The signal lines 25 each extend in the second direction Dy and are arrayed alongside one another in the first direction Dx. The transistors Tr are provided near intersections of the scanning lines 24 and the signal lines 25.

In the following description, the first direction Dx is one direction in a plane parallel to the substrate 71. The second direction Dy is one direction in a plane parallel to the substrate 71 and is orthogonal to the first direction Dx. The second direction Dy may intersect the first direction Dx instead of being orthogonal. A third direction Dz is a direction orthogonal to the first direction Dx and the second direction Dy and is the normal direction of the principal surface of the substrate 71. A "plan view" corresponds to a positional relation when viewed in a direction perpendicular to the substrate 71.

At least one of the signal lines 25 is provided with a slit 25S and separated by the slit 25S in the second direction Dy. In other words, the length of the signal line 25 coupled to one transistor Tr in the second direction Dy is shorter than the length of the display region 21 in the second direction Dy. The TFT substrate SUB1 also includes a coupling wire 25B. The coupling wire 25B electrically couples one signal line 25 and another signal line 25 adjacent to each other in the second direction Dy with the slit 25S interposed therebetween. The one signal line 25 and the other signal line 25 that are adjacent to each other and separated from each other by the slit 25S are formed in the same layer.

The positions of the slit 25S and the coupling wire 25B, the numbers thereof, and a disposition pitch P1 may be changed as appropriate. For example, in the example illustrated in FIG. 5, the slit 25S and the coupling wire 25B are provided at one signal line 25 positioned at the center in the first direction Dx among the signal lines 25. The present disclosure is not limited thereto and the slit 25S and the coupling wire 25B may be provided at every signal line 25. The slit 25S and the coupling wire 25B may be provided at at least one place on one signal line 25. Alternatively, the slits 25S and the coupling wires 25B may be provided for a plurality of respective pixels SPX on one signal line 25.

Figure 6:
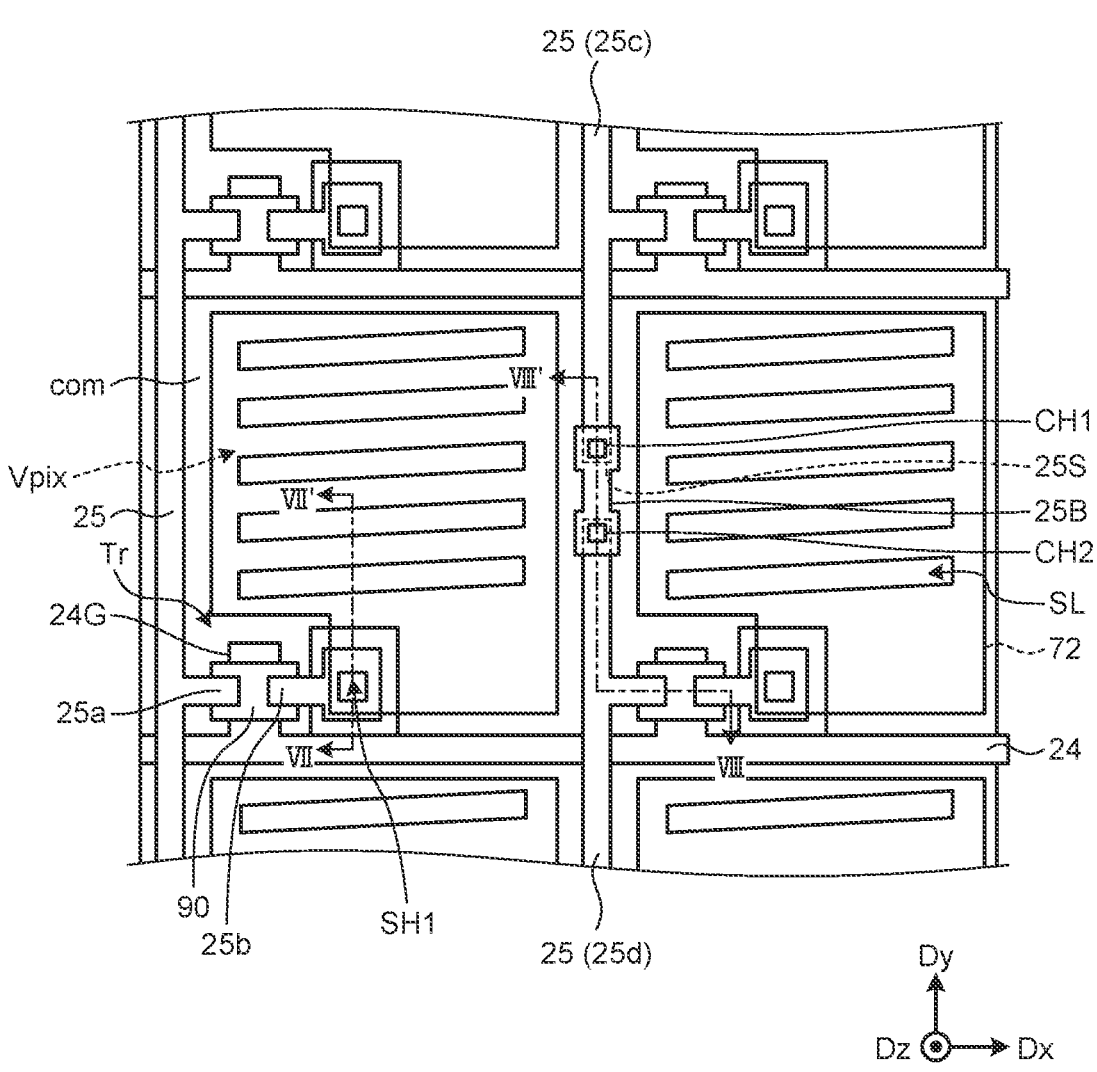
FIG. 6 is an enlarged plan view illustrating a region A illustrated in FIG. 5.

FIG. 6 is an enlarged plan view illustrating a region A illustrated in FIG. 5. FIG. 6 illustrates two pixels SPX adjacent to each other in the first direction Dx in an enlarged manner. As illustrated in FIG. 6, each transistor Tr includes a semiconductor layer 90, a source electrode 25a, a drain electrode 25b, and a gate electrode 24G. In the semiconductor layer 90, an oxide semiconductor is used as a semiconductor material, and for example, zinc oxide (ZnO) or $InGaO_3(ZnO)_m$ (m is a natural number) including indium oxide, gallium oxide, and zinc oxide is used as an oxide semiconductor layer.

The semiconductor layer 90 extends in the first direction Dx along a scanning line 24. One end side of the semiconductor layer 90 in the first direction Dx is coupled to the source electrode 25a, and the other end side is coupled to the drain electrode 25b. The source electrode 25a is coupled to a signal line 25 and bifurcates from the signal line 25 in the first direction Dx. In other words, part of the signal line 25 functions as the source electrode 25a of the transistor Tr. In this manner, the signal line 25 is electrically coupled to the semiconductor layer 90 made of the oxide semiconductor layer in the transistor Tr. The drain electrode 25b is formed in the same layer as the source electrode 25a and electrically coupled to the pixel electrode 72 through a through-hole SH1. In the present embodiment, the scanning line 24 is a wire of metal such as molybdenum (Mo) or aluminum (Al), and the signal line 25 is a wire of metal such as aluminum.

The gate electrode 24G is coupled to the scanning line 24 and bifurcates from the scanning line 24 in the second direction Dy. The gate electrode 24G stereoscopically intersects part of the semiconductor layer 90 and functions as the gate of the transistor Tr. The gate electrode 24G stereoscopically intersects part of the semiconductor layer 90 at one place, and the thin film transistor Tr is a single-gate transistor including a channel region that is an n-channel. The gate electrode 24G is positioned below the semiconductor layer 90, and thus such a structure of the thin film transistor Tr is called a bottom gate structure or an inversely staggered structure.

One signal line 25 is separated by the slit 25S, and one signal line 25c and the other signal line 25d are disposed adjacent to each other in the second direction Dy. The coupling wire 25B extends along the signal line 25. One end side of the coupling wire 25B in the second direction Dy is electrically coupled to the one signal line 25c through a contact hole CH1, and the other end side is electrically coupled to the other signal line 25d through a contact hole CH2. The coupling wire 25B is made of a metal material having favorable conductivity, such as an MAM (Mo/Al/Mo) film that is a multilayered film of molybdenum (Mo) and aluminum (Al), a TAT (Ti/Al/Ti) film that is a multilayered film of titanium (Ti) and aluminum (Al), or a Mo single-layer film. The signal lines 25c and 25d and the coupling wire 25B include contact portions at which the contact holes CH1 and CH2 are formed. The contact portions are formed larger than the width (length in the first direction Dx) of each wire at the portions other than the contact portions. Accordingly, failure of coupling between the signal line 25 and the coupling wire 25B can be prevented.

At the portions other than the contact portions, the coupling wire 25B has the same width (length in the first direction Dx) as the signal line 25. Accordingly, it is possible to reduce variance in capacitance and resistance between the signal line 25 provided with the slit 25S and the coupling wire 25B and a signal line 25 provided with neither the slit 25S nor the coupling wire 25B.

A multilayered structure of the signal line 25, the coupling wire 25B, and the transistor Tr will be described later with reference to FIG. 8.

Figure 7:
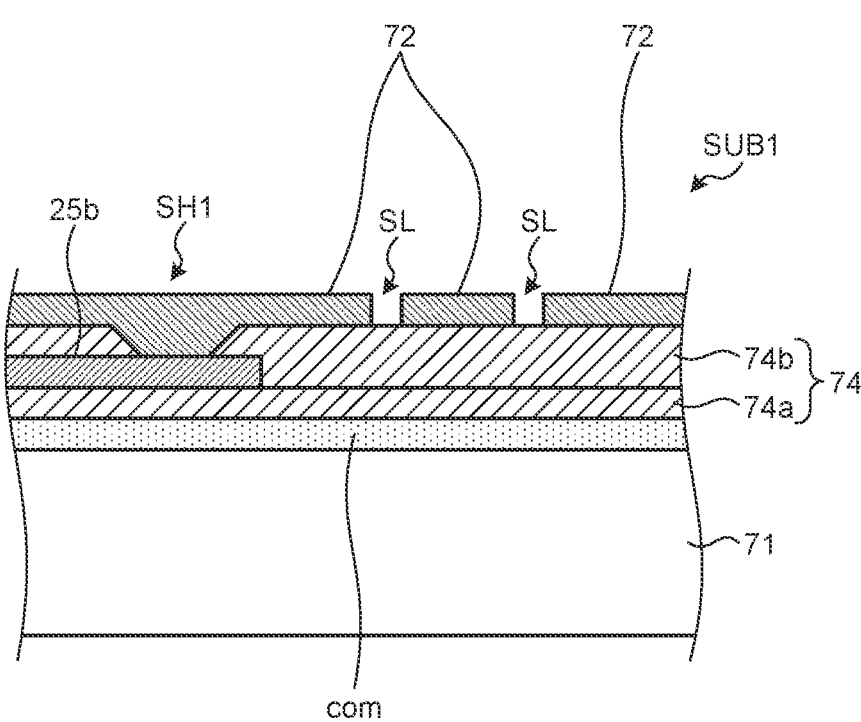
FIG. 7 is a sectional view along VII-VII' in FIG. 6.

FIG. 7 is a sectional view along VII-VII' in FIG. 6. FIG. 7 is a sectional view schematically illustrating a coupling part between the drain electrode 25b and the pixel electrode 72. As illustrated in FIG. 7, the common electrode com, an insulating film 74a, the drain electrode 25b, an insulating film 74b, and the pixel electrode 72 are sequentially stacked on the substrate 71. The pixel electrode 72 and the common electrode com are insulated from each other by an insulating layer 74 (the insulating film 74a, and the insulating film 74b) and opposite each other in the direction perpendicular to a surface of the substrate 71. The pixel electrode 72 and the common electrode com are formed of a translucent conductive material (translucent conductive oxide) such as indium tin oxide (ITO). The insulating films 74a, and 74b of the present embodiment are inorganic insulating films made of silicon nitride (SiN$_x$) or silicon oxide (SiO$_x$). The material of each layer of the insulating films 74a, and 74b is not limited thereto. The insulating films 74a, and 74b may be made of the same insulation material or may be made of different insulation materials. Moreover, the insulating films 74a, and 74b are each not limited to a single-layer film and may be each formed as, for example, a multilayered film made of silicon nitride (SiN$_x$) or silicon oxide (SiO$_x$).

The pixel electrode 72 is provided for each pixel SPX, and an opening SL is formed at each pixel electrode 72. Accordingly, the liquid crystals are driven by an electric field (fringe electric field) leaked through the opening SL of each pixel electrode 72 from an electric field generated between the pixel electrode 72 and the corresponding common electrode com.

Figure 8:
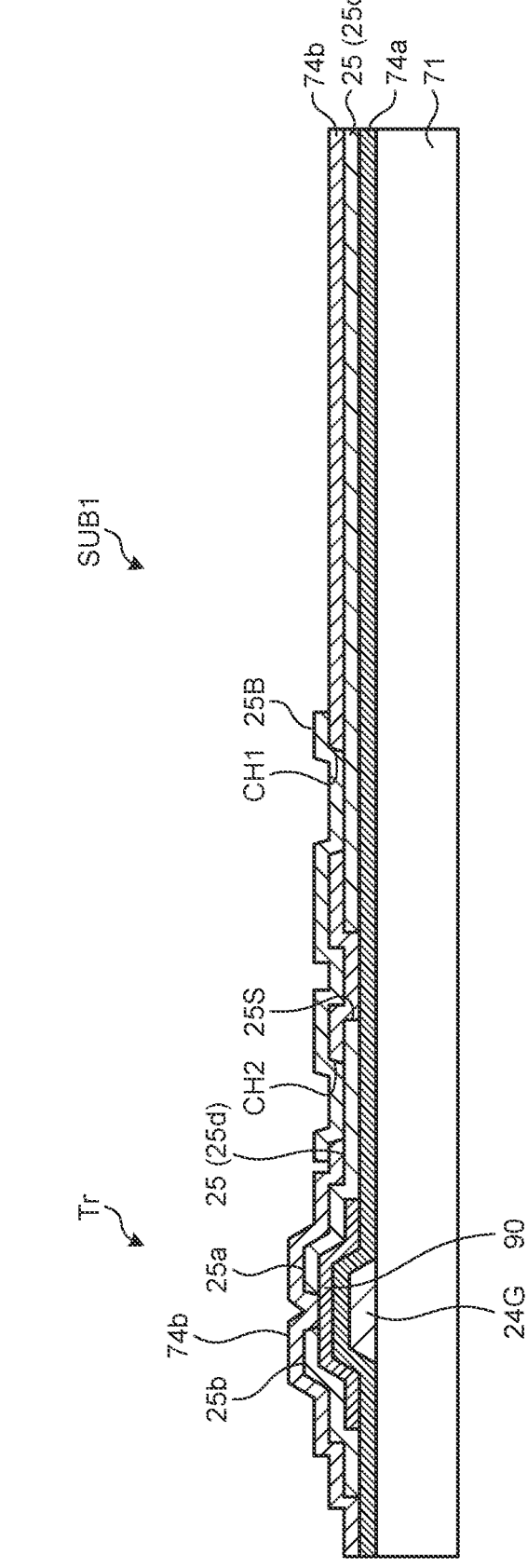
FIG. 8 is a sectional view along VIII-VIII' in FIG. 6.

FIG. 8 is a sectional view along VIII-VIII' in FIG. 6. As illustrated in FIG. 8, the gate electrode 24G, the insulating film 74a, the semiconductor layer 90, the source electrode 25a, the drain electrode 25b, and the insulating film 74b are sequentially stacked on the substrate 71 that is a translucent insulating substrate. More specifically, the insulating film 74a, is provided on the substrate 71 and covers the gate electrode 24G. The semiconductor layer 90 is disposed on the gate electrode 24G with the insulating film 74a, interposed therebetween. Part of the semiconductor layer 90 overlapping the gate electrode 24G is formed as the channel region.

The source electrode 25a and the drain electrode 25b are provided on the semiconductor layer 90 such that the electrodes are disposed on respective sides of the channel region of the semiconductor layer 90 and each contact the semiconductor layer 90. The signal line 25 formed continuously with the source electrode 25a is provided on the insulating film 74a. As described above, one signal line 25 is separated into the one signal line 25c and the other signal line 25d by the slit 25S.

The insulating film 74b covers the source electrode 25a, the drain electrode 25b, the signal line 25, and the semiconductor layer 90. The contact hole CH1 is formed in a region of the insulating film 74b overlapping the one signal line 25c. The contact hole CH2 is formed in a region of the insulating film 74b overlapping the other signal line 25d. No conductor layer such as another wire is provided but the insulating film 74b is continuously provided between the one signal line 25c and the other signal line 25d adjacent to each other in the second direction Dy (refer to FIG. 6) across the slit 25S. In other words, in a region overlapping the slit 25S, the insulating film 74b is stacked on the insulating film 74a in contact with the insulating film 74a.

The coupling wire 25B is provided on the insulating film 74b, has one end side electrically coupled to the one signal line 25c through the contact hole CH1, and has the other end side electrically coupled to the other signal line 25d through the contact hole CH2.

Figure 9:
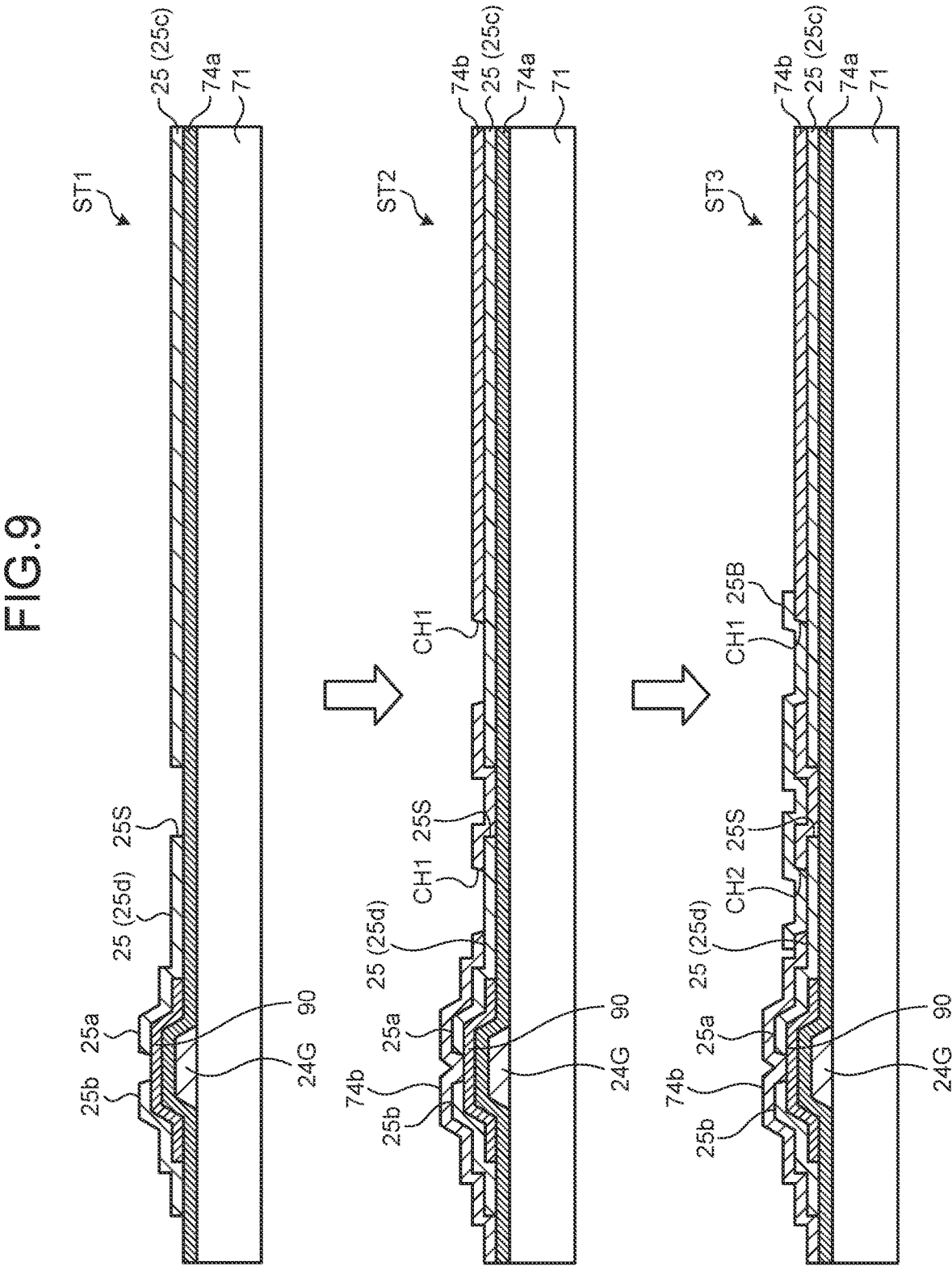
FIG. 9 is a sectional view schematically illustrating a TFT substrate manufacturing method according to the first embodiment.

The following describes a manufacturing method of the TFT substrate SUB1 of the present embodiment. FIG. 9 is a sectional view schematically illustrating a TFT substrate manufacturing method according to the first embodiment.

As illustrated in FIG. 9, the gate electrode 24G, the insulating film 74a, the semiconductor layer 90, and the signal line 25 (the source electrode 25a and the drain electrode 25b) are sequentially stacked on the substrate 71 (step ST1). More specifically, a low-resistance metal to form the scanning line 24 is deposited on the substrate 71 by sputtering, and the shape of the gate electrode 24G is patterned by etching together with the scanning line 24.

Subsequently, the insulating film 74a, is formed on the gate electrode 24G. The insulating film 74a, is formed by, for example, depositing SiN$_x$ at a predetermined thickness by a plasma CVD device.

Subsequently, the semiconductor layer 90 is formed on the insulating film 74a. The semiconductor layer 90 is deposited by a CVD method or a sputtering method using an oxide semiconductor material such as ZnO) or InGaO3 (ZnO)$_m$ and patterned into a predetermined shape.

Subsequently, a low-resistance metal to form the signal line 25 is deposited over the semiconductor layer 90 on the insulating film 74a, by sputtering, and the shapes of the source electrode 25a and the drain electrode 25b are patterned by etching together with the signal line 25. Through the same processing step, the slit 25S of the signal line 25 is formed to separate the signal line 25 into the one signal line 25c and the other signal line 25d.

Subsequently, the insulating film 74b is formed on the signal line 25, the source electrode 25a, and the drain electrode 25b (step ST2). The insulating film 74b is formed by, for example, depositing SiN$_x$ to be the insulating film 74b at a predetermined thickness by the plasma CVD device. The contact holes CH1 and CH2 are formed by removing parts of regions of the insulating film 74b overlapping the one signal line 25c and the other signal line 25d, respectively, by etching.

Subsequently, a low-resistance metal to form the coupling wire 25B is deposited on the insulating film 74b by sputtering, and the shape of the coupling wire 25B is patterned by etching (step ST3). Accordingly, the coupling wire 25B is electrically coupled to the one signal line 25c through the contact hole CH1 and electrically coupled to the other signal line 25d through the contact hole CH2. Accordingly, the TFT substrate SUB1 is manufactured.

Figure 10:
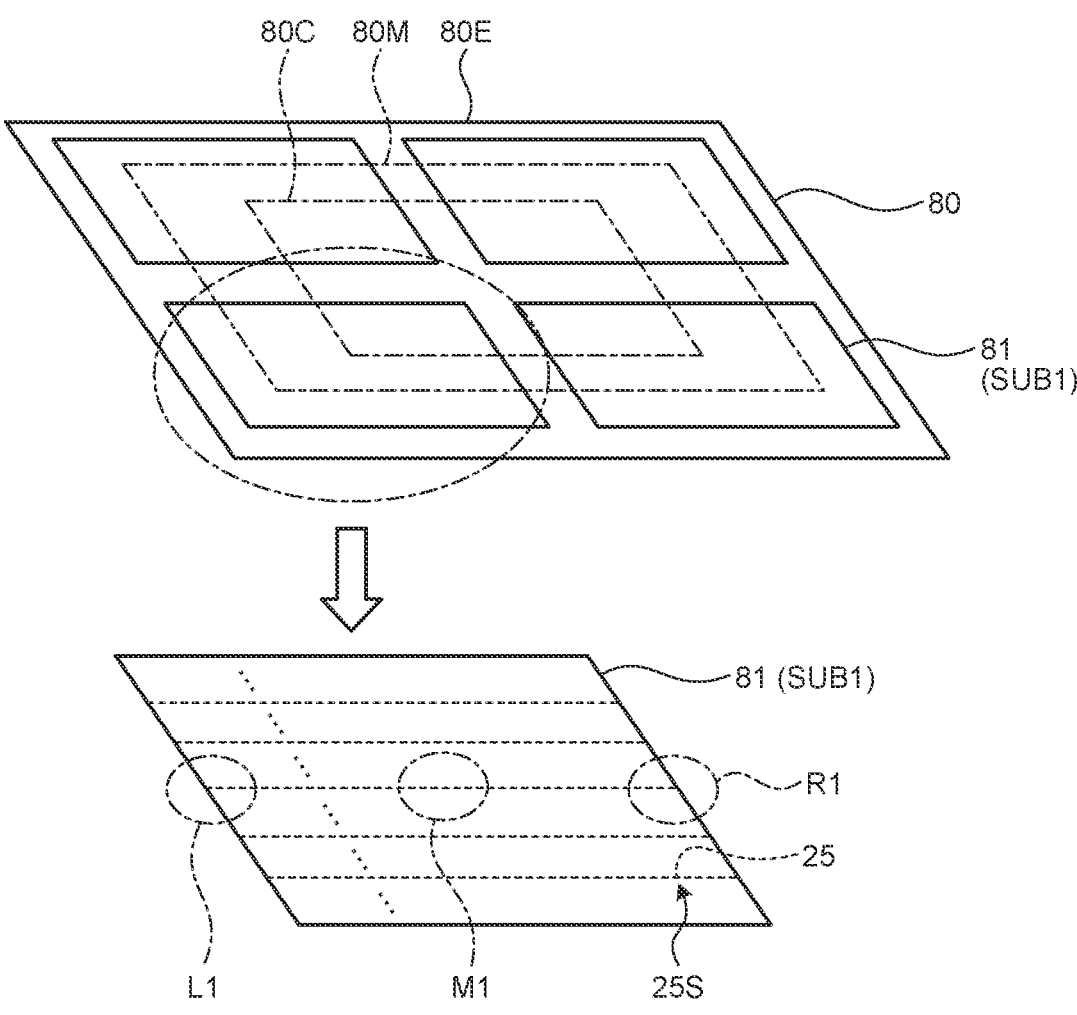
FIG. 10 is an explanatory diagram for description of the TFT substrate manufacturing method according to the first embodiment.
Figure 11:
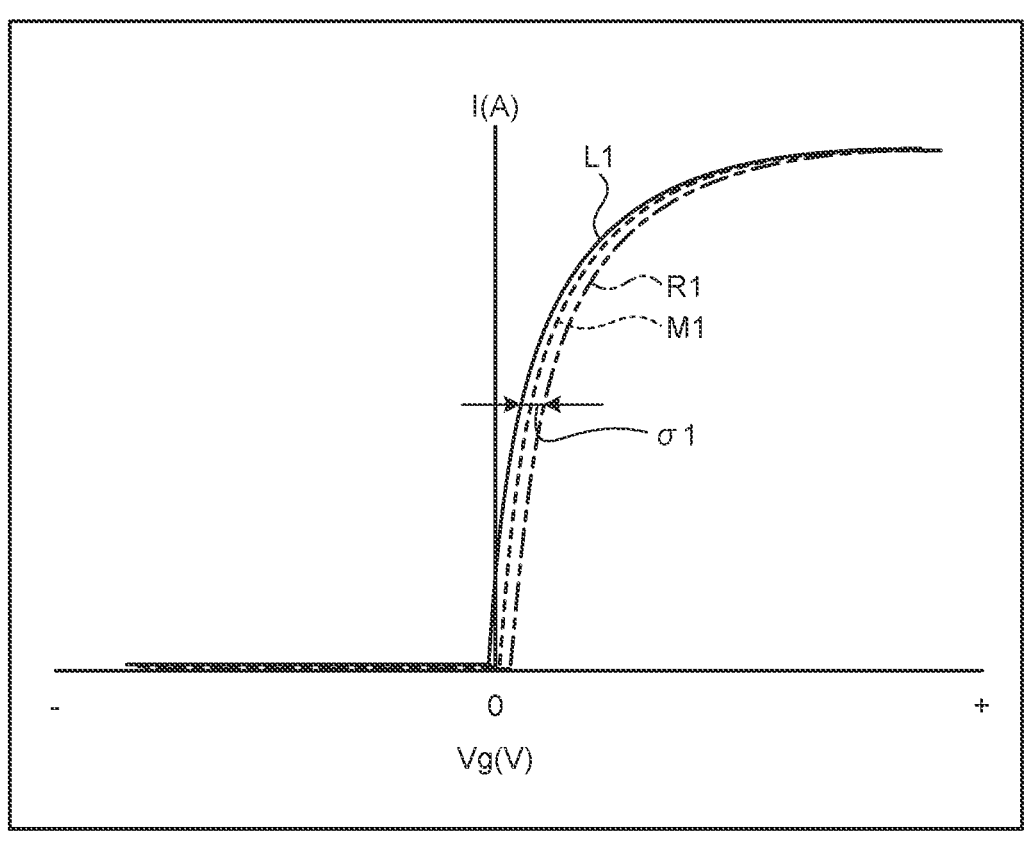
FIG. 11 is a graph schematically illustrating characteristic variance among transistors in the TFT substrate according to the first embodiment.
Figure 12:
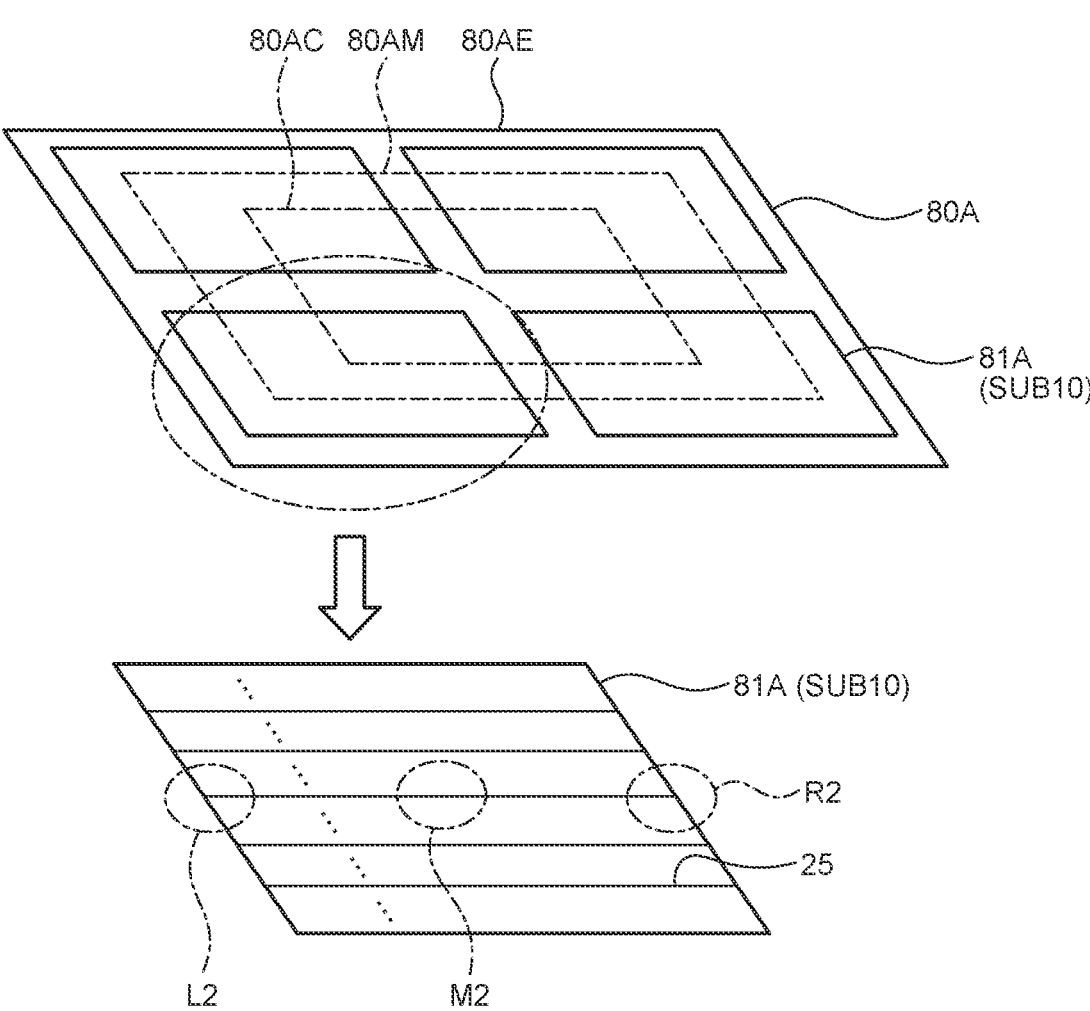
FIG. 12 is an explanatory diagram for description of a TFT substrate manufacturing method according to a comparative example.
Figure 13:
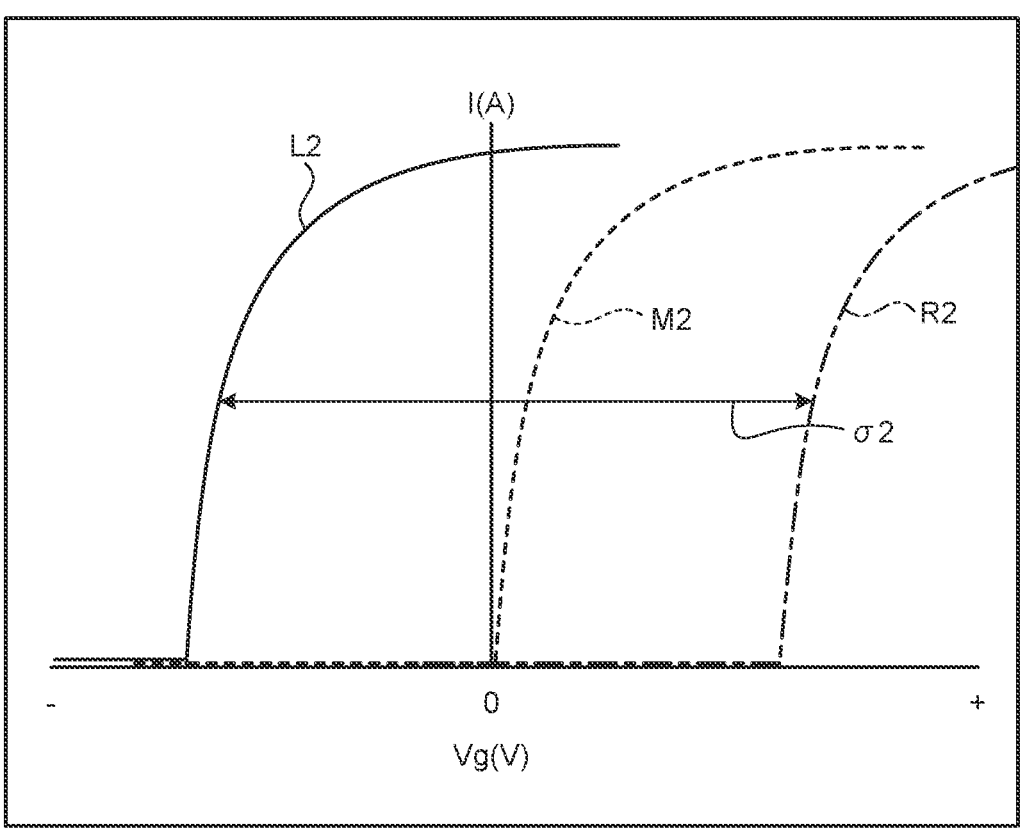
FIG. 13 is a graph schematically illustrating characteristic variance among transistors in a TFT substrate according to the comparative example.

The following describes, with reference to FIGS. 10 to 12, effects of a configuration in which at least one signal line 25 is formed and separated into a plurality of parts by the slit 25S in the TFT substrate SUB1 of the present embodiment. FIG. 10 is an explanatory diagram for description of the TFT substrate manufacturing method according to the first embodiment. FIG. 11 is a graph schematically illustrating characteristic variance among transistors in the TFT substrate according to the first embodiment. FIG. 12 is an explanatory diagram for description of a TFT substrate manufacturing method according to a comparative example. FIG. 13 is a graph schematically illustrating characteristic variance among transistors in a TFT substrate according to the comparative example.

As illustrated in FIG. 10, in the processing steps of manufacturing the TFT substrate SUB1 according to the first embodiment, each processing step described above with reference to FIG. 9 is executed by using a mother substrate 80. A plurality of piece formation regions 81 are arrayed in the mother substrate 80. Each piece formation region 81 corresponds to the TFT substrate SUB1, and a plurality of TFT substrates SUB1 are formed from one mother substrate 80 through division into the piece formation regions 81 after the deposition processing step illustrated in FIG. 9. FIG. 10 is schematically illustrated for clarity of the drawing. In FIG. 10, four piece formation regions 81 are arrayed in the mother substrate 80, but the present disclosure is not limited thereto and a large number, five or more, of piece formation regions 81 may be arrayed in one mother substrate 80.

In each processing step illustrated in FIG. 9, process variance occurs at a central part 80C, a middle part 80M, and a peripheral part 80E of the mother substrate 80. The process variance occurs due to, for example, plasma distribution of a CVD device. For example, plasma density is high at the central part 80C of the mother substrate 80 and sequentially decreases toward the peripheral side through the middle part 80M and the peripheral part 80E in some cases.

In FIG. 10, one piece formation region 81 (TFT substrate SUB1) of the mother substrate 80 is illustrated in an enlarged manner. The above-described process variance occurs within one piece formation region 81 as well. For example, in the piece formation region 81 illustrated in an enlarged manner in FIG. 10, plasma density sequentially increases through a region L1 (left-side region) on one end side in the extension direction of the signal lines 25, a region M1 at a middle part, and a region R1 (right-side region) on the other end side.

As illustrated in FIG. 12, a TFT substrate SUB10 according to the comparative example has a configuration in which no slit 25S is formed and the signal lines 25 are continuously formed from one end to the other end of the display region 21. Process variance occurs at a central part 80AC, a middle part 80AM, and a peripheral part 80AE of a mother substrate 80A according to the comparative example as well. Within one piece formation region 81A (TFT substrate SUB10) as well, plasma density sequentially increases through a region L2 (left-side region) on one end side in the extension direction of the signal lines 25, a region M2 at a middle part, and a region R2 (right-side region) on the other end side.

In the present embodiment, at least one signal line 25 is separated into a plurality of parts by the slit 25S as described above. Accordingly, the length of a signal line 25 coupled to the semiconductor layer 90 of one transistor Tr is shorter than that in the configuration according to the comparative example in which no slit 25S is formed and the signal lines 25 are continuously formed from one end to the other end of the display region 21.

With this configuration, when process variance occurs in the processing steps of forming the semiconductor layer 90 made of an oxide semiconductor, the signal line 25, and the insulating film 74b illustrated in FIG. 9, it is possible to prevent shift of the degree of oxidation from occurring to the semiconductor layer 90 of the transistor Tr through the signal line 25. For example, it is possible to reduce variance in the degree of oxidation between a semiconductor layer 90 in the region L1 (left-side region) on one end side and a semiconductor layer 90 in the region R1 (right-side region) on the other end side among a plurality of semiconductor layers 90 arrayed along one signal line 25.

More specifically, electric charge distribution potentially occurs to the signal line 25 by process variance. In this case, in the comparative example, variance in the degree of oxidation among the semiconductor layers 90 made of an oxide semiconductor is more significant as the length of the signal line 25 coupled to the semiconductor layers 90 is longer. However, in the present embodiment, since the signal line 25 is separated by the slit 25S, the length of the signal line 25 coupled to the semiconductor layers 90 made of an oxide semiconductor is shorter. Accordingly, electric charge distribution in the signal line 25 coupled to the semiconductor layers 90 is smaller than that in the signal line 25 according to the comparative example. As a result, variance in the degree of oxidation among the semiconductor layers 90 through the signal line 25 is reduced in the present embodiment.

FIG. 11 illustrates the VI characteristic of a transistor Tr in each of the region (left-side region) L1 on one end side, the region M1 at the middle part, and the region (right-side region) R1 on the other end side in the TFT substrate SUB1 of the present embodiment illustrated in FIG. 10. FIG. 13 illustrates the VI characteristic of a transistor Tr in each of the region (left-side region) L2 on one end side, the region M2 at the middle part, and the region (right-side region) R2 on the other end side in the TFT substrate SUB10 according to the comparative example illustrated in FIG. 12. In FIGS. 11 and 13, the horizontal axis represents gate voltage, and the vertical axis represents drain current. The graphs in FIGS. 11 and 13 each merely schematically illustrate the VI characteristic of the transistors Tr.

As illustrated in FIG. 11, in the present embodiment, variance in the degree of oxidation among the semiconductor layers 90 in the region L1 (left-side region) on one end side, the region M1 at the middle part, and the region R1 (right-side region) on the other end side can be reduced, and accordingly, variance σ1 in a threshold voltage Vth of the transistors Tr can be decreased.

However, in the comparative example, as illustrated in FIG. 13, variance in the degree of oxidation through the signal line 25 among the semiconductor layers 90 in the region L2 (left-side region) on one end side, the region M2 at a middle part, and the region R2 (right-side region) on the other end side is large, and accordingly, variance σ2 in the threshold voltage Vth of the transistors Tr is large. The variance σ1 in the present embodiment is 1.0 V or smaller, for example, 0.1 V approximately, and the variance σ2 in the comparative example is 1.0 V or larger, for example, 10 V approximately.

As described above, in the present embodiment, at least one signal line 25 in the TFT substrate SUB1 is separated into a plurality of parts by the slit 25S. Accordingly, variance in the degree of oxidation among the semiconductor layers 90 through the signal line 25 is reduced, the variance depending on variance in the processes of forming the layers of the semiconductor layer 90 made of an oxide semiconductor, the signal line 25, and the insulating film 74b illustrated in FIG. 9. As a result, it has been found that characteristic variance among the transistors Tr using the semiconductor layers 90 made of an oxide semiconductor can be reduced. The numbers of the slits 25S and the coupling wires 25B, disposition patterns thereof, and the disposition pitch P1 may be changed as appropriate in accordance with the above-described process variance (for example, plasma distribution of a CVD device), a time constant of the signal line 25, and the like.

Modification

Figure 14:
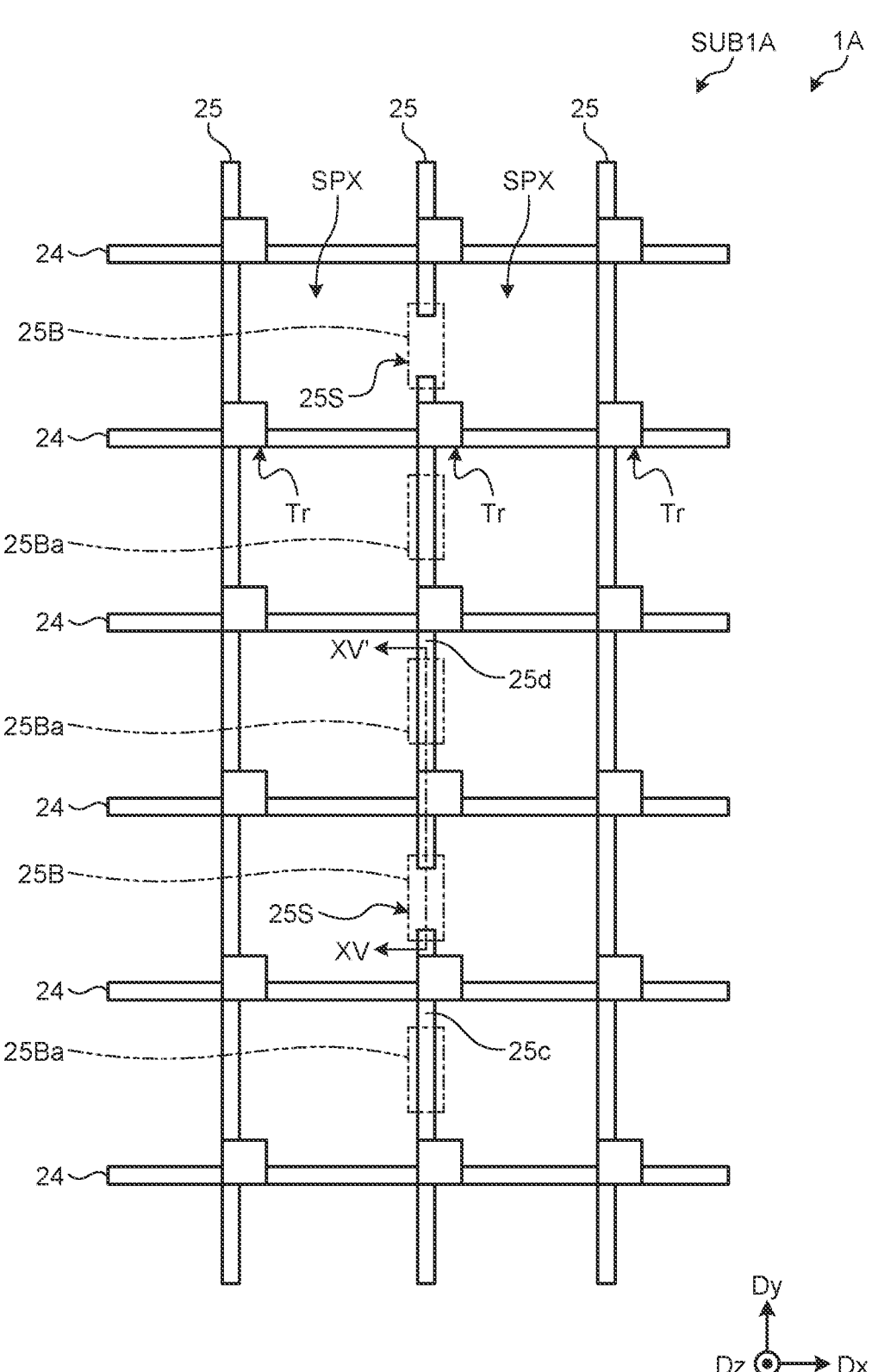
FIG. 14 is a plan view schematically illustrating the relation among transistors, scanning lines, and signal lines in a TFT substrate according to a modification of the first embodiment.

FIG. 14 is a plan view schematically illustrating the relation among transistors, scanning lines, and signal lines in a TFT substrate according to a modification of the first embodiment. As illustrated in FIG. 14, in a TFT substrate SUB1A (display device 1A) according to the modification, a plurality of coupling wires 25B and 25Ba are provided for a plurality of pixels SPX, respectively, in the extension direction (second direction Dy) of the signal lines 25.

More specifically, the plurality of coupling wires 25B and 25Ba are disposed in a manner aligned in the second direction Dy over one signal line 25. Each coupling wire 25B is provided in a region overlapping a slit 25S of the signal line 25. Each coupling wire 25Ba is provided over a region of the signal line 25 in which no slit 25S is provided.

Figure 15:
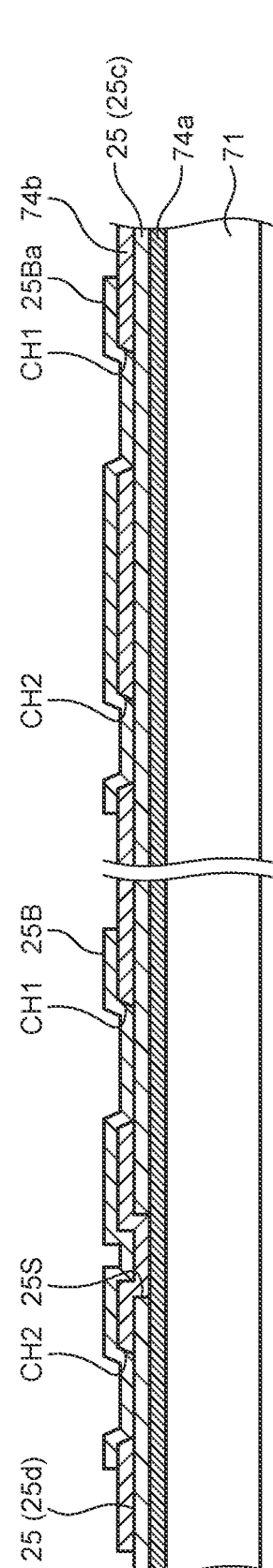
FIG. 15 is a sectional view along XV-XV' in FIG. 14.

FIG. 15 is a sectional view along XV-XV' in FIG. 14. Similarly to the first embodiment described above, as illustrated in FIG. 15, at the part of the signal line 25 at which the slit 25S is provided, the coupling wire 25B is provided on the insulating film 74b, has one end side electrically coupled to the one signal line 25c through the contact hole CH1, and has the other end side electrically coupled to the other signal line 25d through the contact hole CH2.

At the part of the signal line 25 at which no slit 25S is provided, the coupling wire 25Ba is provided on the insulating film 74b, has one end side electrically coupled to the one signal line 25c through the contact hole CH1, and has the other end side electrically coupled to the same one signal line 25c through the contact hole CH2. Accordingly, the coupling wire 25Ba is coupled in parallel to the one signal line 25c. With this configuration, the TFT substrate SUB1A according to the modification can reduce the resistance of the signal line 25.

For example, one coupling wire 25B (slit 25S) may be provided at one of 15 pixels SPX arranged in the second direction Dy, and each coupling wire 25Ba may be provided at corresponding one of the other 14 pixels SPX among the 15 pixels SPX arranged in the second direction Dy. However, the present disclosure is not limited thereto, and the numbers and disposition patterns of the coupling wires 25B and 25Ba may be changed as appropriate in accordance with the above-described process variance (for example, plasma distribution of a CVD device), the time constant of the signal line 25, and the like.

The first embodiment and the modification are described with the examples in which the TFT substrates SUB1 and SUB1A are employed in the display device 1 including a liquid crystal element as a display element, but the present disclosure is not limited thereto. The TFT substrates SUB1 and SUB1A may be employed in, for example, an organic EL display panel (organic light emitting diode (OLED)), an inorganic EL display panel (micro LED or mini LED), or an electrophoretic display (EPD) panel including an electrophoretic element as a display element. The TFT substrates SUB1 and SUB1A may be employed in another electronic apparatus different from the display device 1.

Second Embodiment

Figure 16:
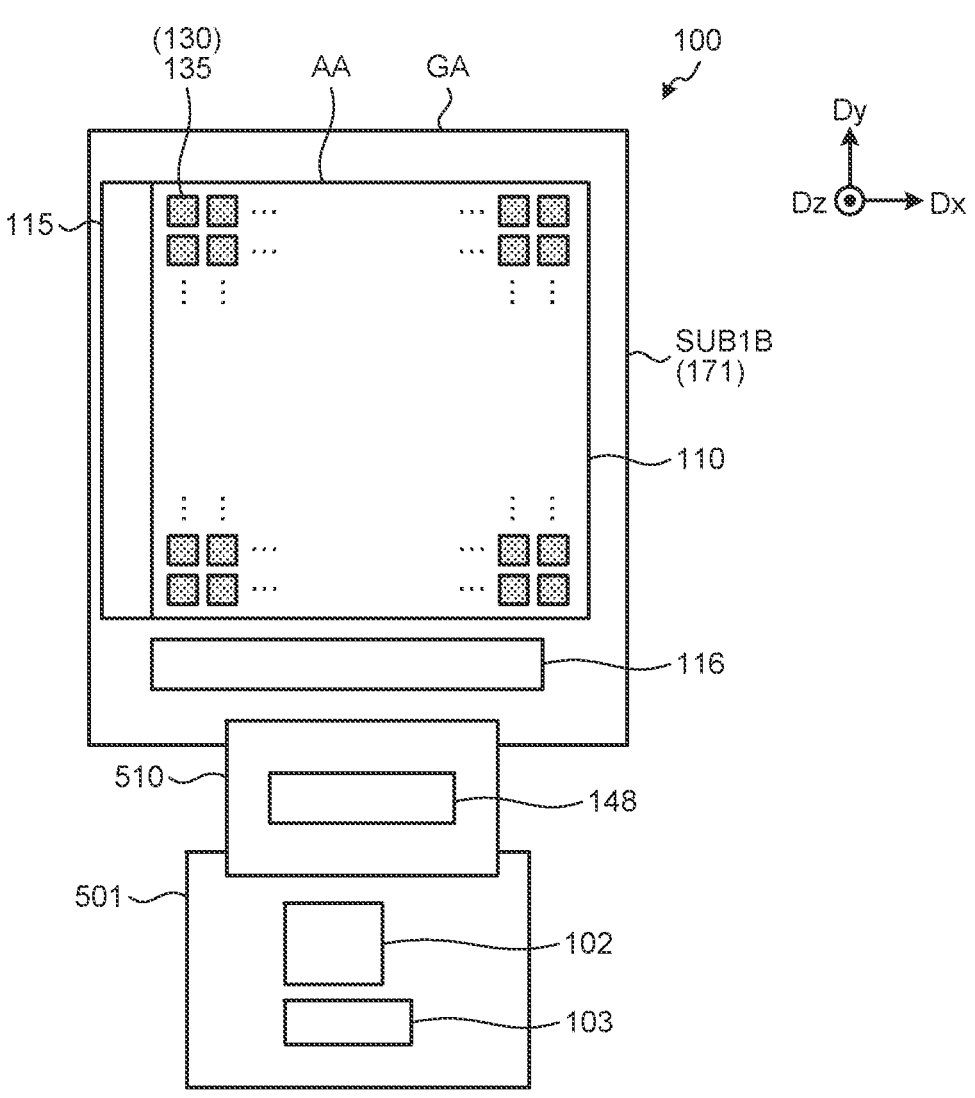
FIG. 16 is a plan view illustrating an exemplary detection device including a TFT substrate according to a second embodiment.

FIG. 16 is a plan view illustrating an exemplary detection device including a TFT substrate according to a second embodiment. In the following description, any component identical to that in the above-described embodiment is denoted by the same reference sign, and duplicate description thereof is omitted.

The second embodiment will be described with a configuration in which a TFT substrate SUB1B is employed in a detection device 100. The detection device 100 is an optical sensor including PIN-type photodiodes 130 as sensor elements. The detection device 100 is configured as a fingerprint sensor capable of detecting information such as a fingerprint based on light from a detection target body such as a finger. Alternatively, the detection device 100 may be configured as a living body sensor configured to detect a blood vessel image of a finger or a palm, a pulse wave, a pulse, a blood oxygen level, or the like.

As illustrated in FIG. 16, the detection device 100 includes the TFT substrate SUB1B (substrate 171), a sensor unit 110, a scanning line drive circuit 115, a signal line selection circuit 116, a detection circuit 148, a control circuit 102, and a power circuit 103.

A control board 501 is electrically coupled to the TFT substrate SUB1B (substrate 171) through a wiring board 510. The wiring board 510 is, for example, a flexible printed circuit or a rigid board. The wiring board 510 includes the detection circuit 148. The control board 501 includes the control circuit 102 and the power circuit 103. The control circuit 102 is, for example, a field programmable gate array (FPGA). The control circuit 102 controls detection operation of the sensor unit 110 by supplying a control signal to the sensor unit 110, the scanning line drive circuit 115, and the signal line selection circuit 116. The power circuit 103 supplies voltage signals such as a power potential SVS and a reference potential VR1 (refer to FIG. 17) to the sensor unit 110, the scanning line drive circuit 115, and the signal line selection circuit 116.

The TFT substrate SUB1B includes a detection region AA and a peripheral region GA. The detection region AA is a region in which the photodiodes 130 included in the sensor unit 110 are provided. The peripheral region GA is a region between the outer periphery of the detection region AA and the outer edge of the substrate 171 and is a region in which the photodiodes 130 are not provided.

The scanning line drive circuit 115 and the signal line selection circuit 116 are provided in the peripheral region GA. Specifically, the scanning line drive circuit 115 is provided in a region extending in the second direction Dy in the peripheral region GA. The signal line selection circuit 116 is provided in a region extending in the first direction Dx in the peripheral region GA and is provided between the sensor unit 110 and the detection circuit 148.

A plurality of detection elements 135 of the sensor unit 110 are each an optical sensor including a photodiode 130 as a sensor element. Each photodiode 130 is a photoelectric conversion element and outputs an electric signal in accordance with light incident thereon. More specifically, each photodiode 130 is a positive intrinsic negative (PIN) photodiode. Alternatively, each photodiode 130 may be an organic photodiode (OPD) using an organic semiconductor. The detection elements 135 (photodiodes 130) are arrayed in a matrix (row-column configuration) in the detection region AA.

The photodiodes 130 included in the detection elements 135 perform detection in accordance with a gate drive signal supplied from the scanning line drive circuit 115. Each of the photodiodes 130 outputs an electric signal as a detection signal Vdet to the signal line selection circuit 116 in accordance with light incident thereon. The detection device 100 detects information related to a detection target body based on the detection signals Vdet from the photodiodes 130.

Figure 17:
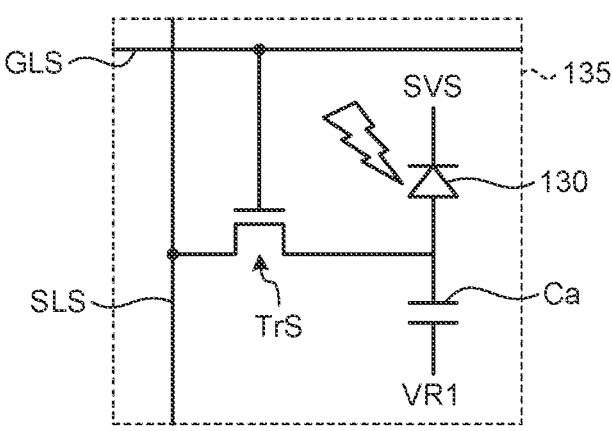
FIG. 17 is a circuit diagram illustrating a detection element in the TFT substrate according to the second embodiment.

FIG. 17 is a circuit diagram illustrating each detection element in a TFT substrate according to the second embodiment. As illustrated in FIG. 17, the detection element 135 includes the photodiode 130, a capacitor element Ca, and a transistor TrS. The transistor TrS is provided for the photodiode 130. The transistor TrS is configured as a thin film transistor, and in this example, configured as an n-channel MOS TFT. The gate of the transistor TrS is coupled to a scanning line GLS. The source of the transistor TrS is coupled to an output signal line SLS. The drain of the transistor TrS is coupled to the anode of the photodiode 130 and the capacitor element Ca.

The power potential SVS is supplied from the power circuit 103 to the cathode of the photodiode 130. The reference potential VR1 as the initial potential of the capacitor element Ca is supplied from the power circuit 103 to the capacitor element Ca.

When light is incident on the detection element 135, a current in accordance with the quantity of the light flows through the photodiode 130, and accordingly, electric charge is accumulated in the capacitor element Ca. When the transistor TrS is turned on, a current flows to the output signal line SLS in accordance with the electric charge accumulated in the capacitor element Ca. The output signal line SLS is coupled to the detection circuit 148 through the signal line selection circuit 116. Accordingly, the detection device 100 can detect, at each detection element 135, a signal in accordance with the quantity of light incident on the photodiode 130.

Although only one detection element 1353 is illustrated in FIG. 17, the scanning line GLS and the output signal line SLS are coupled to a plurality of the detection elements 135. Specifically, the scanning line GLS extends in the first direction Dx (refer to FIG. 16) and is coupled to a plurality of detection elements 135 arrayed in the first direction Dx. The output signal line SLS extends in the second direction Dy and is coupled to a plurality of the detection elements 135 arrayed in the second direction Dy.

Although not illustrated, similarly to the first embodiment, at least one output signal line SLS is separated in the second direction Dy by a slit in the TFT substrate SUB1B of the present embodiment as well. The output signal lines SLS separated in the second direction Dy are electrically coupled through a coupling wire 125B formed in a different layer.

Figure 18:
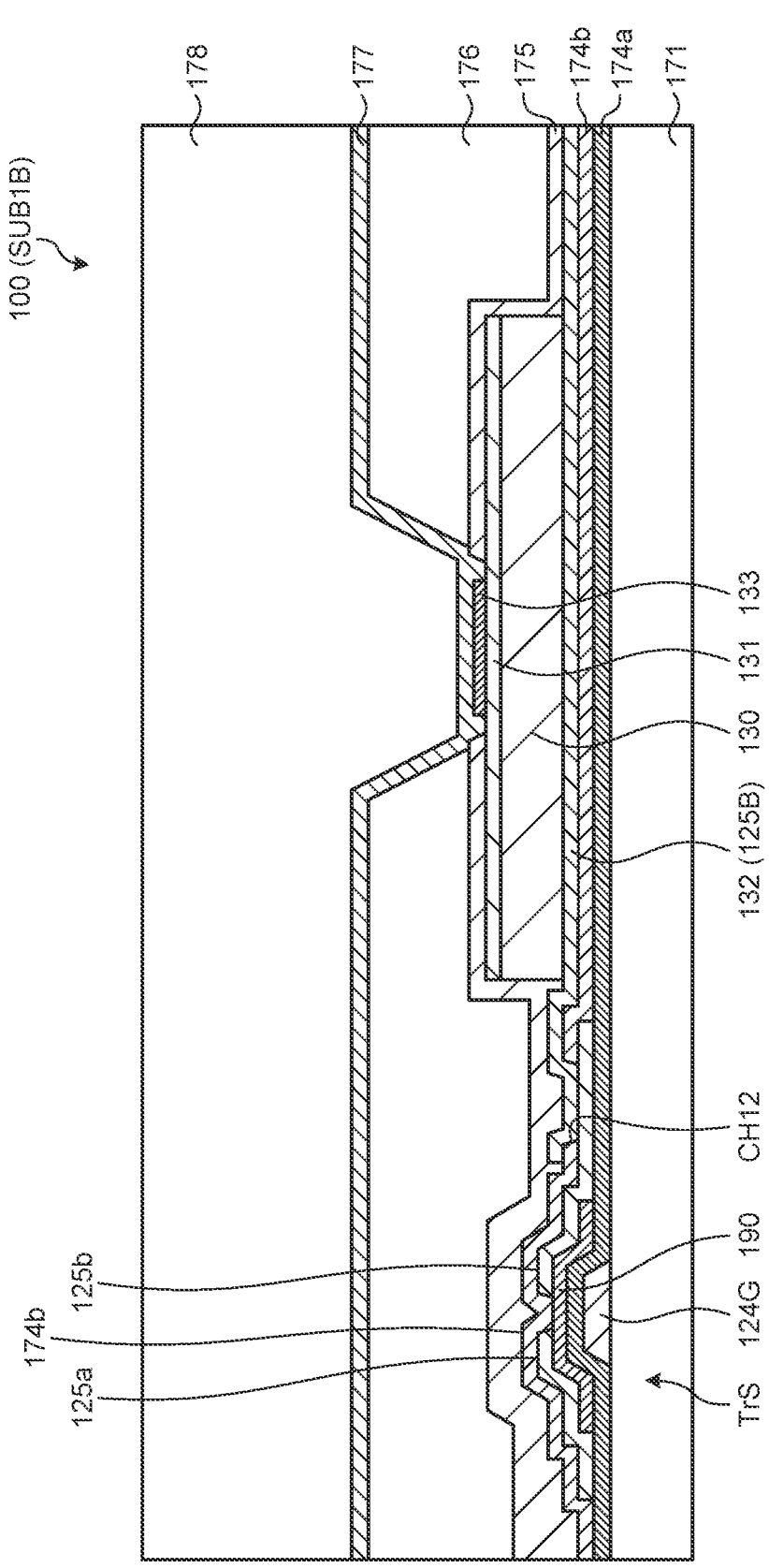
FIG. 18 is a sectional view schematically illustrating the TFT substrate according to the second embodiment.

FIG. 18 is a sectional view schematically illustrating the TFT substrate according to the second embodiment. As illustrated in FIG. 8, the transistor TrS has a configuration in which a gate electrode 124G, an insulating film 174a, a semiconductor layer 190, a source electrode 125a, a drain electrode 125b, and an insulating film 174b are sequentially stacked on the substrate 171 that is a translucent insulating substrate. The semiconductor layer 190 is made of an oxide semiconductor as a semiconductor material. The transistor TrS has the same multilayered structure as the transistor Tr described above with reference to FIG. 8, and thus repetition of description is omitted.

The photodiode 130 is disposed on the insulating film 174b. More specifically, a lower electrode 132, the photodiode 130, and an upper electrode 131 are sequentially stacked on the insulating film 174b.

The lower electrode 132 is provided on the insulating film 174b and extends from a region overlapping the photodiode 130 to the transistor TrS side. The lower electrode 132 is electrically coupled to the drain electrode 125b through a contact hole CH12. The lower electrode 132 is the anode of the photodiode 130 and is an electrode for reading the detection signal Vdet. The lower electrode 132 is provided in the same layer as the coupling wire 125B and made of the same material as the coupling wire 125B, for example, a metal material such as an MAM (Mo/Al/Mo) film, a TAT (Ti/Al/Ti) film, or a Mo single-layer film. Alternatively, the lower electrode 132 may be a multilayered film in which a plurality of these metal materials are stacked. The lower electrode 132 may be made of a translucent conductive material such as ITO.

The photodiode 130 includes an i-type semiconductor layer, an n-type semiconductor layer, and a p-type semiconductor layer as semiconductor layers. The i-type semiconductor layer, the n-type semiconductor layer, and the p-type semiconductor layer are formed of, for example, amorphous silicon (a-Si). Although not illustrated, the p-type semiconductor layer, the i-type semiconductor layer, and the n-type semiconductor layer are sequentially stacked in a direction perpendicular to a surface of the substrate 171.

The n-type semiconductor layer forms an n+ region when a-Si is doped with impurities. The p-type semiconductor layer forms a p+ region when a-Si is doped with impurities. The i-type semiconductor layer is, for example, an undoped intrinsic semiconductor and has conductivity lower than those of the n-type semiconductor layer and the p-type semiconductor layer.

The upper electrode 131 is the cathode of the photodiode 130 and is an electrode supplying the power potential SVS to a photoelectric conversion layer. The upper electrode 131 is a translucent conductive layer made of ITO, for example, and a plurality of the upper electrodes 131 are provided for the respective photodiodes 130.

An insulating film 175 and an insulating film 176 are provided over the insulating film 174b and the lower electrode 132 extending from the photodiode 130. The insulating film 175 is, for example, an inorganic insulating film, and the insulating film 176 is, for example, an organic insulating film. The insulating film 175 and the insulating film 176 cover a peripheral part of the upper electrode 131 and are provided with openings at a position overlapping the upper electrode 131. A power supply wire 133 is coupled to the upper electrode 131 in a region overlapping the openings of the insulating film 175 and the insulating film 176. An insulating layer 177 is provided on the insulating film 176 and covers the upper electrode 131 and the power supply wire 133. An insulating layer 178 as a flattening layer is provided on the insulating layer 177.

The detection device 100 including the TFT substrate SUB1B is configured as described above. The configuration of the detection device 100 is merely exemplary and may be changed as appropriate. For example, the lower electrode 132 of the photodiode 130 may be provided in a layer different from the coupling wire 125B.

Preferable embodiments of the present disclosure are described above, but the present disclosure is not limited to such embodiments. Contents disclosed in the embodiments are merely exemplary, and various kinds of modifications are possible without departing from the gist of the present disclosure. Any modification performed as appropriate without departing from the gist of the present disclosure belongs to the technical scope of the present disclosure. At least one of omission, replacement, and change of various kinds of components may be performed without departing from the gist of the embodiments and modifications described above.

What is claimed is:

1. A TFT substrate comprising:
a substrate;
a plurality of transistors provided on the substrate and each including an oxide semiconductor layer;
a plurality of scanning lines electrically coupled to gates of the transistors and extending in a first direction;
a plurality of signal lines electrically coupled to the oxide semiconductor layers of the transistors and extending in a second direction intersecting the first direction;
an insulating film covering the signal lines and the oxide semiconductor layers; and
a coupling wire provided on the insulating film, wherein at least one of the signal lines is separated in the second direction by a slit, the coupling wire electrically couples one signal line and another signal line adjacent to each other in the second direction across the slit, and under the coupling wire disposed overlapping no scanning lines, no conductor layer is provided but the insulating film is continuously provided between the one signal line and the other signal line adjacent to each other in the second direction across the slit.

2. The TFT substrate according to claim 1, further comprising a plurality of coupling wires, wherein the coupling wires are disposed in a manner aligned in the second direction over one of the signal lines, and are respectively provided over at least one region overlapping the slit of the signal line and a region of the signal line in which the slit is not provided.

3. The TFT substrate according to claim 1, wherein each of the coupling wires has the same width as the corresponding signal line.

4. The TFT substrate according to claim 1, wherein the signal lines are disposed in a layer above a layer of the scanning lines, and the coupling wire is disposed in a layer above a layer of the signal lines.

\* \* \* \* \*